(12) United States Patent
Lotfi et al.

(10) Patent No.: US 6,682,962 B2
(45) Date of Patent: Jan. 27, 2004

(54) GAAS MOSFET HAVING LOW CAPACITANCE AND ON-RESISTANCE AND METHOD OF MANUFACTURING THE SAME

(75) Inventors: Ashraf W. Lotfi, Bridgewater, NJ (US); Jian Tan, Bridgewater, NJ (US)

(73) Assignee: Agere Systems, Inc., Allentown, PA (US)

( * ) Notice: Subject to any disclaimer, the term of this patent is extended or adjusted under 35 U.S.C. 154(b) by 97 days.

(21) Appl. No.: 09/927,194

(22) Filed: Aug. 10, 2001

(65) Prior Publication Data

US 2001/0050393 A1 Dec. 13, 2001

Related U.S. Application Data

(62) Division of application No. 09/412,847, filed on Oct. 6, 1999.

(51) Int. Cl.[7] ............................. H01L 21/00; H01L 21/84
(52) U.S. Cl. ........................................ 438/149; 438/454
(58) Field of Search ............................. 438/149, 140, 438/454, 545

(56) References Cited

U.S. PATENT DOCUMENTS

| 3,890,215 A | * | 6/1975 | KeLorenzo et al. ...... 204/129.2 |
| 5,357,130 A | * | 10/1994 | Scholz et al. ................ 257/288 |
| 5,406,096 A | * | 4/1995 | Malhi ........................... 257/114 |
| 5,767,547 A | * | 6/1998 | Merchant et al. ........... 257/347 |
| 5,821,171 A | | 10/1998 | Hong et al. |
| 5,886,881 A | | 3/1999 | Xia et al. |

FOREIGN PATENT DOCUMENTS

WO  WO 94/02962  2/1994

* cited by examiner

*Primary Examiner*—Amir Zarabian
*Assistant Examiner*—Pamela E Perkins

(57) ABSTRACT

A metal-oxide semiconductor field effect transistor (MOSFET), a method of manufacturing the MOSFET and a power supply incorporating at least one such MOSFET. In one embodiment, the MOSFET includes: (1) a substrate having an epitaxial layer underlying a gate oxide layer, a portion of the epitaxial layer being a gate region of the MOSFET, (2) an N-type drift region located in the epitaxial layer laterally proximate the gate region and (3) source and drain regions located in the epitaxial layer and laterally straddling the gate and drift regions.

14 Claims, 5 Drawing Sheets

GAAS MOSFET HAVING LOW CAPACITANCE AND ON-RESISTANCE AND METHOD OF MANUFACTURING THE SAME

This application is a divisional of Ser. No. 09/412,847 filed on Oct. 6, 1999, currently. The above-listed application Ser. No. 09/412,847 is commonly assigned with the present invention and is incorporated herein by reference.

TECHNICAL FIELD OF THE INVENTION

The present invention is directed, in general, to semiconductor fabrication and, more specifically, to a gallium arsenide metal-oxide semiconductor field effect transistor (GaAs MOSFET) having low capacitance and on-resistance and method of manufacturing the same.

BACKGROUND OF THE INVENTION

Power conversion circuitry commonly employed in a variety of electronic circuits. Integrated circuits (ICs) are no exception and large demand for improved functionality and enhanced performance continues to increase. In an effort to meet these demands, the IC industry continues to decrease the size of component devices to place more circuits in the same amount of space. Over the last several years, structures have diminished from 1.2 $\mu$m gate areas to gate areas of 0.25 $\mu$m and promise to become even smaller in the future.

The ever-increasing demand for smaller components places strict operating constraints on individual devices. As power converter circuitry continues to shrink, minimizing the factors that increase both the resistance and the total capacitance of the power switching device becomes critical.

Currently, power switching devices built on silicon suffer from such resistance and capacitance problems, which limit further improvement. The resistance of the silicon substrate is inherently higher than desired. Furthermore, the vertical structuring of the layers from which such devices are composed causes high channel resistance and undesirable drift region resistance. For instance, as circuit integration approaches the 0.5 $\mu$m level, the drift resistance between source and drain regions of the device is the dominant performance limiting factor.

However, when low blocking-voltage, typically less than 100 V, designs are desired, the channel resistance also becomes a significant portion of the overall device resistance. Therefore, if drift resistance can be reduced, power switching devices having reduced channel resistance will also be required for low-voltage applications. Channel resistance appears to be limited by the characteristics of the gate oxide interface. High temperature annealing steps produce a rough interface between the oxide and underlying doped regions. Much effort has been expended in the search for processes that reduce the interface irregularities. Also, gate oxide materials having inherently better interface characteristics have been sought. Such efforts have met with moderate success as evidenced by the limitations of current state-of-the-art devices.

Accordingly, what is needed in the art is a device for power switching applications that has improved drift and channel resistance profiles and method of manufacturing the same.

SUMMARY OF THE INVENTION

To address the above-discussed deficiencies of the prior art, the present invention provides a MOSFET, a method of manufacturing the MOSFET and a power supply incorporating at least one such MOSFET. In one embodiment, the MOSFET includes: (1) a substrate having an epitaxial layer underlying a gate oxide layer, a portion of the epitaxial layer being a gate region of the MOSFET, (2) an N-type drift region located in the epitaxial layer laterally proximate the gate region and (3) source and drain regions located in the epitaxial layer and laterally straddling the gate and drift regions. In this application, the term "laterally straddling" means being located on both sides of.

The present invention therefore introduces the broad concept of structuring a MOSFET laterally, such that its channel resistance, and therefore its input and output capacitances and on-resistance, are reduced. In an embodiment to be illustrated and described, the substrate employed to fabricate a MOSFET according to the principles of the present invention comprises gallium arsenide.

In one embodiment of the present invention, the epitaxial layer is beryllium-doped. Those skilled in the pertinent art will understand that other conventional P-type or N-type dopants fall within the broad scope of the present invention.

In one embodiment of the present invention, the gate oxide layer comprises gallium III oxide. In an embodiment to be illustrated and described, the gate oxide layer is formed by way of electron beam evaporation from a single-crystal source.

In one embodiment of the present invention, the drift, drain and source regions comprise a silicon dopant. Those skilled in the pertinent art will understand that other conventional N-type dopants fall within the broad scope of the present invention.

In one embodiment of the present invention, the MOSFET further includes an N layer located in the epitaxial layer and between the gate region and the gate oxide layer. The N layer is preferably doped such that, at zero bias, a first depletion region within the N layer proximate the gate region contacts a second depletion region within the N layer proximate the gate oxide layer.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
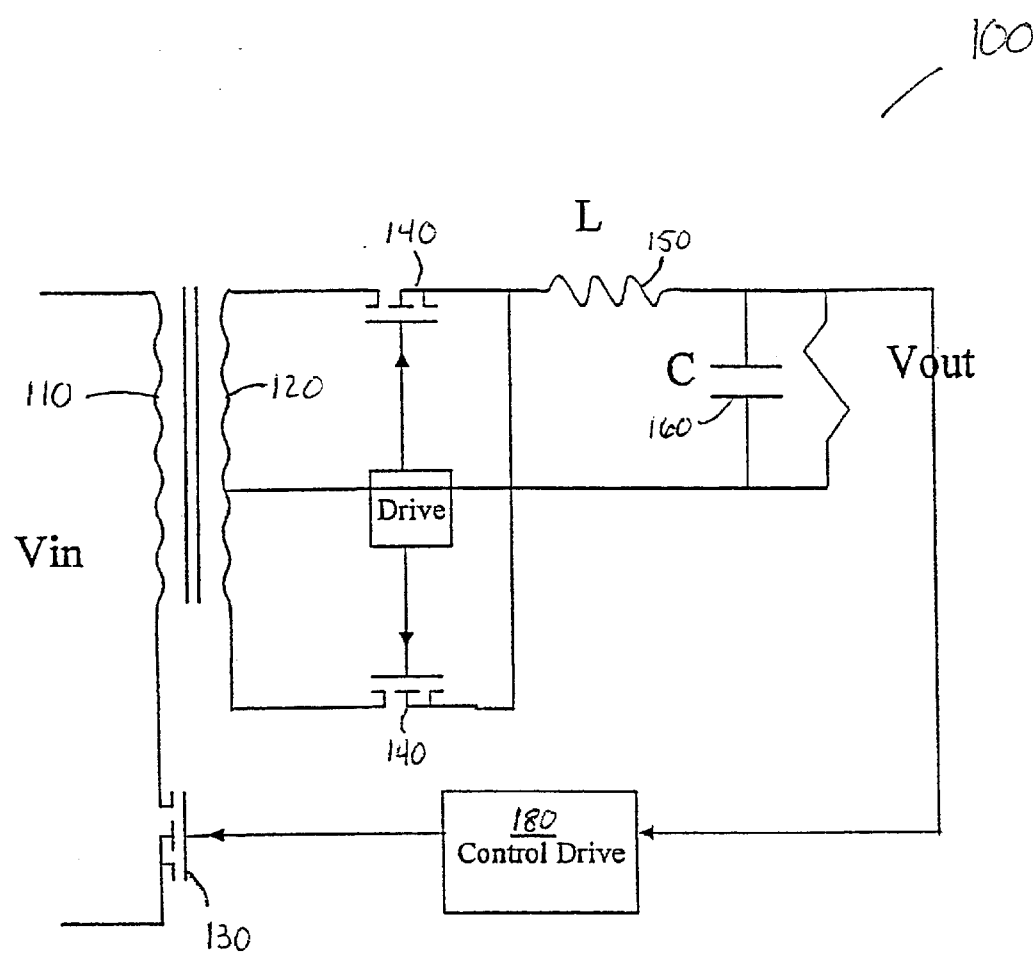
FIG. 1 illustrates a typical power conversion circuit that may advantageously employ a power switching device constructed according to the principles of the present invention.

Referring initially to FIG. 1, illustrated is an exemplary power conversion circuit 100. The power conversion circuit 100 includes an isolation transformer having a primary winding 110 and a secondary winding 120. Coupled to the primary winding 110 is a primary-side power switch 130. Such a circuit also includes secondary-side power switches 140 coupled to the secondary winding and an output inductor 150 coupled to the at least one of the secondary-side power switches 140. An output capacitor 160 is coupled to the output inductor 150 across an output of the power supply 170. The power supply circuit 100 also has a control drive 180, coupled to the primary-side power switch 130, for providing control signals to the power switch 130.

Figure 2:
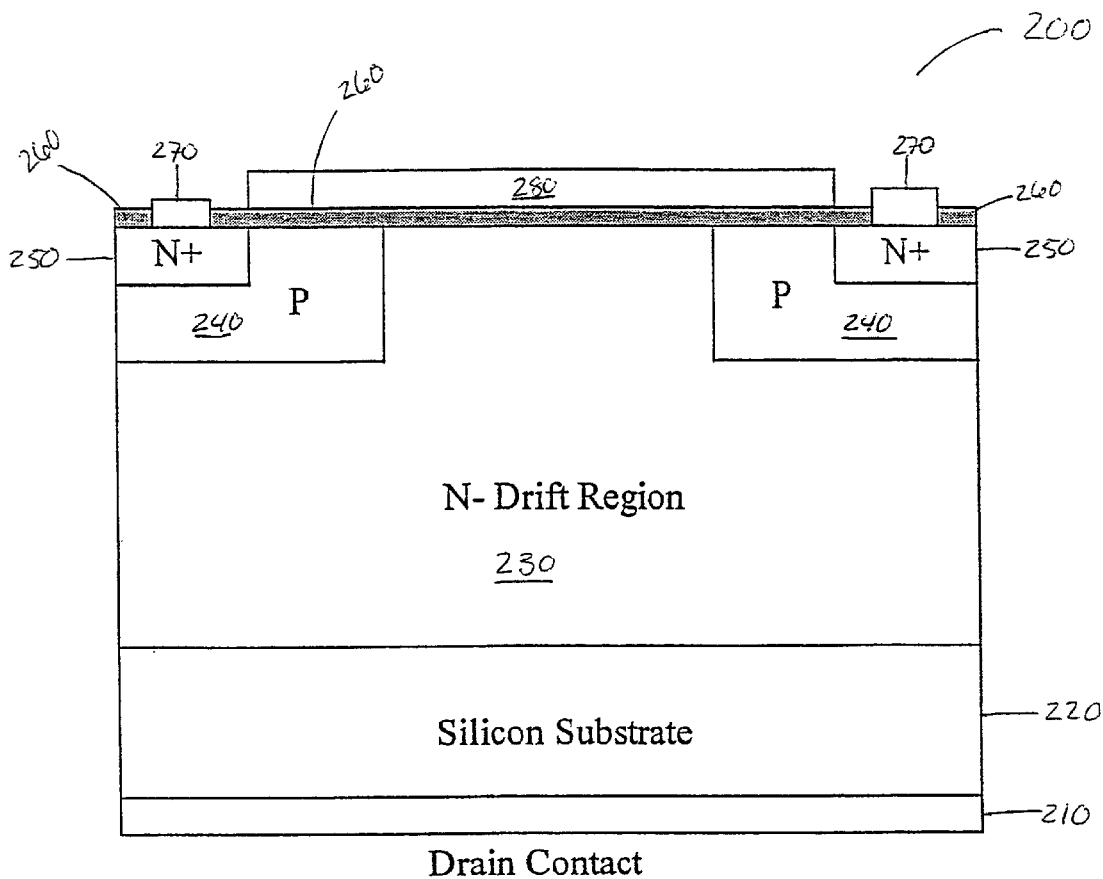
FIG. 2 illustrates a cross-sectional view of a prior art power switching device.
Figure 3:
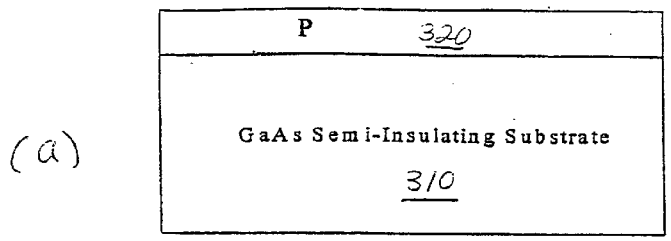
FIG. 3 illustrates a cross-sectional view of an exemplary embodiment of a power switching device, constructed according to the principles of the present invention, that may be coupled to either or both of the primary and secondary windings of the power conversion circuit of FIG. 1.
Figure 3:
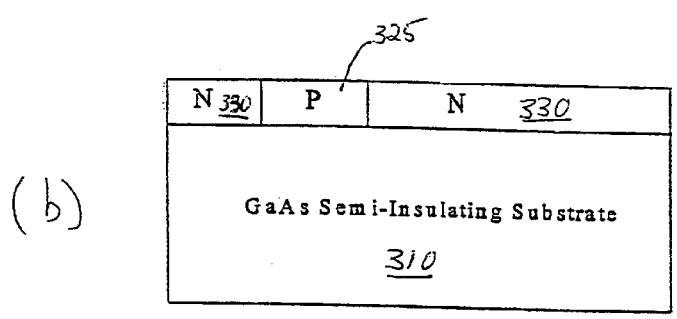
Figure 3:
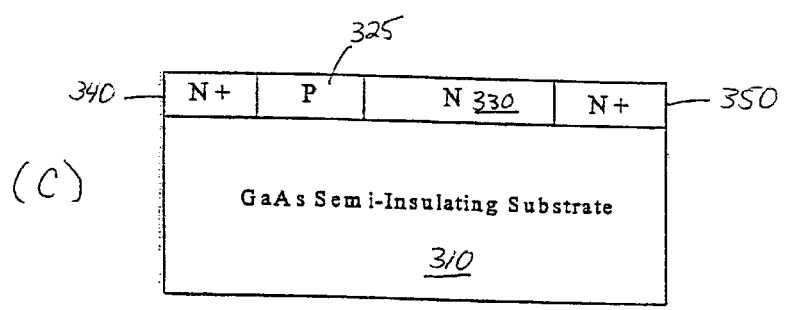
Figure 3:
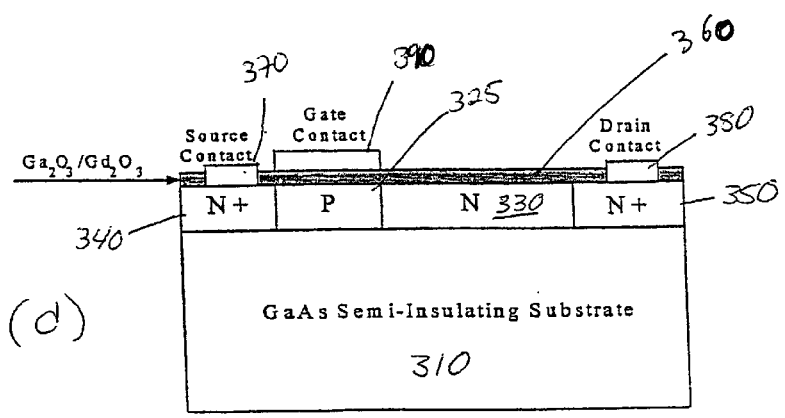

Turning now to FIG. 2, illustrated is a cross-sectional view of a prior art power switching device 200 that may be used as the primary-side power switch 130 or one or both of the secondary-side power switches 140 in the power converter circuit 100 of FIG. 1.

The device 200 is a vertically structured metal-oxide semiconductor device (VDMOS). The device 200 includes a drain contact layer 210 over which a silicon substrate 220 is formed. An N-drift region 230 is then formed in the silicon substrate according to conventional methods, followed by formation of P-doped regions 240 to define a gate. On either side of the gate and within the P-doped regions 240, N+ regions 250 are formed. A gate oxide layer 260 is deposited over the exposed surfaces of the N+ regions 250, the P-doped regions 240, and the N-drift region 230. The gate oxide layer 260 is patterned and the desired source contacts 270 are formed connecting to the N+ regions 250. Finally, a gate contact layer 280 is deposited over the gate oxide layer 260 and at least partially overlapping the P-doped layers 240. The methods and materials for forming the various layers and regions of such a VDMOS device are well-known to those skilled in the art.

Turning now to FIGS. 3a–d, illustrated are cross-sectional views of an exemplary embodiment of a power switching device 300 constructed according to the principles of the present invention. In one embodiment, the power switching device 300 may replace the prior art power switch 130 on the primary winding of the power conversion circuit 100 of FIG. 1. In other embodiments the device 300 may replace one or both of the secondary-side power switches 140. In a further embodiment both the primary- and secondary-side power switches may be the switching device 300.

The power switching device 300 of the present invention is formed on a substrate which is preferably a semi-insulating gallium arsenide (GaAs) substrate. In the illustrated embodiment, a P-type layer 320 is formed on the substrate 310. Any material that is currently known or subsequently found to be suitable for forming P-doped layers is envisioned by the current invention. In one particularly desirable embodiment, the P-type layer 320 is formed by doping the substrate 310 with beryllium. In another embodiment, the layer 320 is formed epitaxially. The thickness of the P-type layer 320 will vary according to design specifications. Other methods for forming such P-type layers are known to those skilled in the art may also be used to form the P-type layer 320.

After the P-type layer 320 is formed, a photoresist, implant mask is used to convert portions of the P-type layer 320 to N-drift regions 330. The N-drift regions 330 may be formed by conventional methods. In a particularly useful embodiment, the N-drift regions 330 are formed by silicon implantation. The N-drift regions 330 are formed to isolate a gate region 325 of the unmodified P-type region that is laterally bordered by the N-drift region. Portions of the N-drift regions 330 are then converted to N+ source and drain regions 340 and 350, according to conventional methods. The source and drain regions 340 and 350 laterally straddle the gate region 325 and an unmodified portion of the N-drift region 330. There is substantially no N-drift region separating the source region 340 and the unmodified gate region 325. In one embodiment the source and drain regions are formed by silicon implantation and activation at 850° C. While the source and drain regions 340 and 350 may be formed by silicon implantation, one skilled in the art will appreciate that other conventional or later-discovered methods for forming N+ source and drain regions may be used. While the embodiment described calls for the source and drain regions 340 and 350 to be formed in the same process step, one skilled in the art will also understand that the source and drain regions 340 and 350 may be formed in separate steps.

Once the doped regions have been properly formed on the substrate 310, a gate oxide layer 360 is deposited. Gate oxide deposition is performed in a multi-chamber molecular beam epitaxy (MBE) system that includes a solid source GaAs-based III-V chamber and an oxide decomposition chamber with a background pressure below $10^{-9}$ torr. First, native oxide impurities are thermally desorbed at substrate temperatures in the range of 580° C. to 600° C. in the III-V chamber under an arsenic (As) over-pressure. After oxide desorption, the desired thickness of gate oxide layer 360 is deposited under ultra-high vacuum ($10^{-10}$ torr) conditions in the deposition chamber. The thickness of the gate oxide layer may vary according to design specifications; however, in one embodiment, the desired thickness is approximately 20 nm. In a particularly advantageous embodiment, the gate oxide layer 360 is deposited as substantially gallium (III) oxide, $Ga_2O_3$ at a substrate temperature of approximately 535° C. by electron-beam evaporation from a single-crystal source of $Ga_5Gd_3O_{12}$. Further details of some acceptable gate oxide layer deposition parameters can be found in U.S. Pat. No. 5,821,171 to Hong, et. al., incorporated herein by reference.

The gate oxide layer 360 is then patterned so that source and drain contact regions 370 and 380 may be formed. A gate metal region 390 is formed over at least a portion of the gate oxide layer 360. Materials for the gate metal and contact metals may be any material currently known or subsequently discovered to be suitable for such purposes.

This laterally constructed device offers several advantages over prior art VDMOS devices. The lateral structure substantially eliminates substrate resistance. Also, drift resistance which limits the performance in VDMOS prior art devices is substantially eliminated. Therefore the present invention is especially well-suited for deep-level integration. The GaAs substrate material provides a higher breakdown field that is 1.5 times higher than that of silicon. Electron mobility in the GaAs substrate is 5 times greater than in silicon. Therefore, the device according to the present invention shows approximately a 10-fold reduction in drift resistance compared to prior art VDMOS switches. The total resistance of power switches constructed according to the principles of the present invention will have less than one-tenth of the total resistance of prior art VDMOS devices.

The power conversion switch just described provides a substantial improvement in operating characteristics when incorporated into a power conversion circuit such as circuit 100. Such switch is particularly useful where low voltage and high current are required. For example, in an 8V output supply operating at 50 amps, prior art MOSFET switches operate at about 82% efficiency. If the prior art switches are replaced with those constructed according to the principles of the present invention, the on-resistance is reduced by a factor of about 6 and the efficiency increases to around 92%. Such a level of operating efficiency is extremely difficult to achieve with prior art silicon-based power conversion switches.

Figure 4:
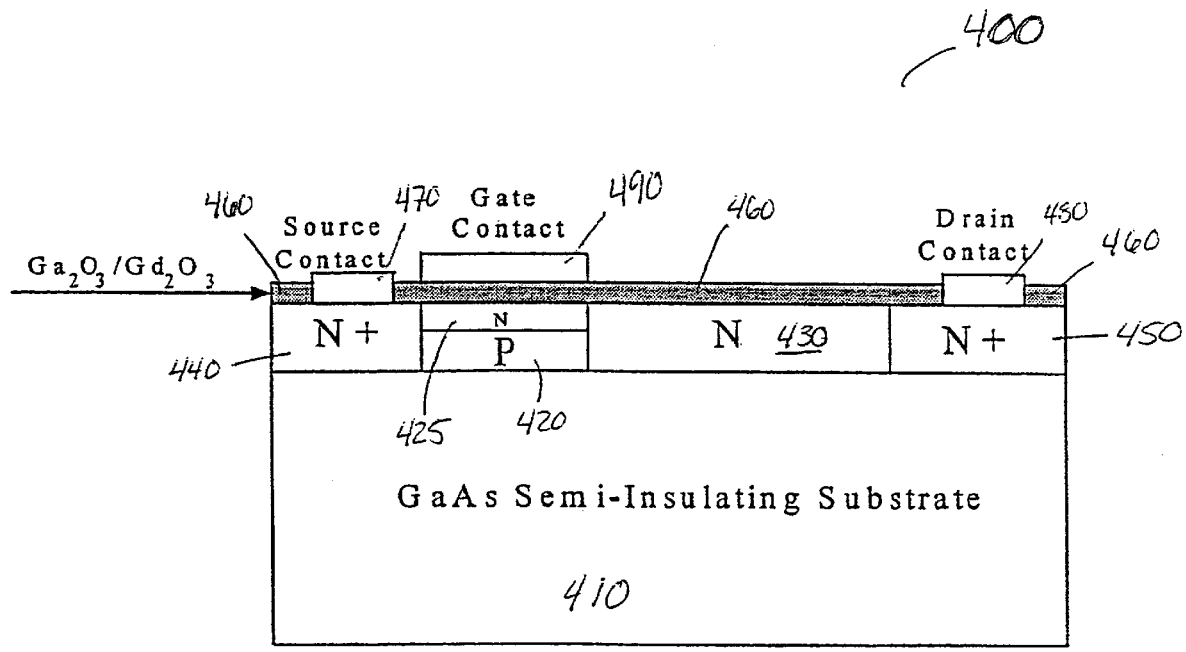
FIG. 4 illustrates a further embodiment of the present invention that incorporates an N-type layer underlying the gate oxide in the gate region.

Turning now to FIG. 4, illustrated is an embodiment 400 of the present invention that further incorporates an N-type layer underlying the gate oxide in the gate region 420. The GaAs substrate 410, gate region 420, N-drift regions, and laterally straddling N+ source and drain regions 440 and 450, respectively, are formed in the manner described in conjunction with FIG. 3. Following masking and patterning, an upper portion of the gate region 420 is then doped to form a thin N-type layer 425 over the unmodified portion of the gate region 420. Such processing steps may be performed by methods known to those skilled in the art. After formation of the N-type layer 425, the gate oxide layer 460, source 470 and drain 480 contacts, and the gate contact 490 may be formed in the manner described above with respect to FIG. 3.

Figure 5:
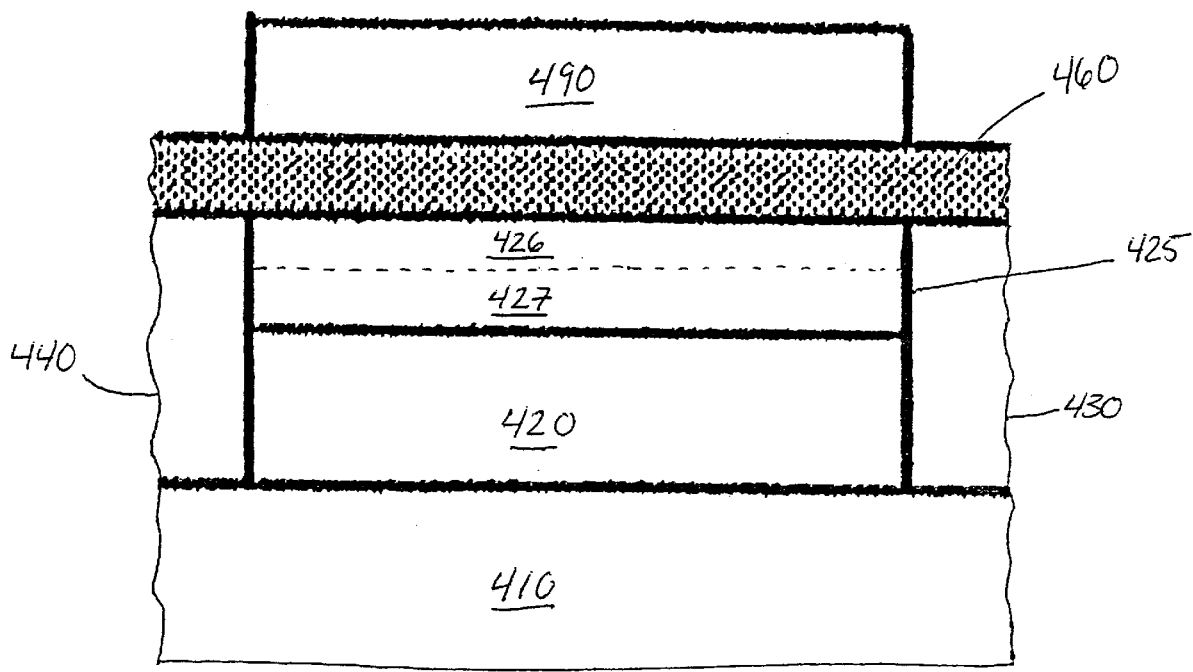
FIG. 5 illustrates a magnified view of the device of FIG. 4 showing the first and second depletion regions within the N-layer of the embodiment of FIG. 4.

Turning now to FIG. 5, illustrated is a magnified view of the device of FIG. 4. The N-type layer 425 is advantageously (but not necessarily) designed to have a thickness and dopant concentration such that, at zero bias, the first depletion region 426 within the N-layer 425 contacts the underlying second depletion region 427. Further, the surface roughness of the N-type layer 425 should be less than the width of depletion region 426. In one embodiment, the surface roughness is approximately 5 nm. The N-layer 425 has an N-dopant concentration of $2 \times 10^{17}$ cm$^{-3}$ inducing the depletion region 426 to have a width of 100 nm.

Such characteristics should cause the device of FIGS. 4 and 5 to be a normally-off device. When a positive bias is applied to the device, an accumulation channel is formed and the N-layer 425 increases the effective channel mobility, concomitantly reducing the channel resistance of the device dramatically. The reduced channel resistance of the device allows the device of the present invention to be used in low voltage applications where the prior art is inadequate. While the N-layer 425 has been described with respect to the power converter switches of the present invention, such a layer may be used in any other GaAs MOSFET structure as a way to increase channel mobility.

Although the present invention has been described in detail, those skilled in the art should understand that they can make various changes, substitutions and alterations herein without departing from the spirit and scope of the invention in its broadest form.

What is claimed is:

1. A method of manufacturing a metal-oxide semiconductor field effect transistor (MOSFET), comprising:

forming an epitaxial layer over a semi-insulating substrate, a portion of the epitaxial layer being a gate region of the MOSFET;

forming a gate oxide layer over the epitaxial layer employing electron beam evaporation from a single-crystal source;

forming an N-type drift region in the epitaxial layer laterally proximate the gate region; and forming source and drain regions in the epitaxial layer, the source and drain regions laterally straddling the gate and drift regions.

2. The method as recited in claim 1 wherein the substrate comprises gallium arsenide.

3. The method as recited in claim 1 wherein the forming the epitaxial layer comprises doping a portion of the substrate with beryllium.

4. The method as recited in claim 1 wherein the forming the drift region comprises doping a portion of the epitaxial layer with silicon.

5. The method as recited in claim 1 wherein the forming the source and drain regions comprises doping portions of the epitaxial layer with silicon.

6. The method as recited in claim 1 further comprising:

forming an N layer in the epitaxial layer and between the gate region and the gate oxide layer; and doping the N layer such that, at zero bias, a first depletion region within the N layer proximate the gate region contacts a second depletion region within the N layer proximate the gate oxide layer.

7. The method as recited in claim 1 wherein the MOSFET is a lateral MOSFET.

8. A method of manufacturing a metal-oxide semiconductor field effect transistor (MOSFET), comprising:

forming an epitaxial layer over a substrate, a portion of the epitaxial layer being a gate region of the MOSFET;

forming a gate oxide layer over the epitaxial layer and the gate region by employing electron beam evaporation from a single-crystal source;

forming an N-type drift region in the epitaxial layer laterally proximate the gate region; and forming source and drain regions in the epitaxial layer, the source and drain regions laterally straddling the gate and drift regions.

9. The method as recited in claim 8 wherein the substrate comprises gallium arsenide.

10. The method as recited in claim 8 wherein the forming the epitaxial layer comprises doping a portion of the substrate with beryllium.

11. The method as recited in claim 8 wherein the forming the drift region comprises doping a portion of the epitaxial layer with silicon.

12. The method as recited in claim 8 wherein the forming the source and drain regions comprises doping portions of the epitaxial layer with silicon.

13. The method as recited in claim 8 further comprising:

forming an N layer in the epitaxial layer and between the gate region and the gate oxide layer; and doping the N layer such that, at zero bias, a first depletion region within the N layer proximate die gate region contacts a second depletion region within the N layer proximate the gate oxide layer.

14. The method as recited in claim 8 wherein the substrate is a semi-insulating substrate.

* * * * *